United States Patent [19]

Crafts

[11] Patent Number: 4,928,160
[45] Date of Patent: May 22, 1990

[54] GATE ISOLATED BASE CELL STRUCTURE WITH OFF-GRID GATE POLYSILICON PATTERN

[75] Inventor: Harold S. Crafts, Fort Collins, Colo.

[73] Assignee: NCR Corporation, Dayton, Ohio

[21] Appl. No.: 297,355

[22] Filed: Jan. 17, 1989

[51] Int. Cl.$^5$ ................. H01L 29/34; H01L 27/02; H01L 27/10
[52] U.S. Cl. .................................. 357/54; 357/51; 357/45
[58] Field of Search .................. 357/45, 42, 40, 51

[56] References Cited

U.S. PATENT DOCUMENTS

| | | |
|---|---|---|
| 4,161,662 | 7/1979 | Malcolm et al. |
| 4,549,131 | 12/1982 | Kusazaki ........................ 357/51 |
| 4,562,453 | 12/1985 | Noguchi et al. |
| 4,570,176 | 2/1986 | Kolwicz |
| 4,633,571 | 1/1987 | Kolwicz |
| 4,661,815 | 4/1987 | Takayama et al. |
| 4,745,084 | 5/1988 | Rowson et al. |
| 4,783,692 | 11/1988 | Uratani ........................... 357/45 |
| 4,825,273 | 4/1989 | Arakawa |

FOREIGN PATENT DOCUMENTS 0122771 7/1983 Japan ............................ 357/45

OTHER PUBLICATIONS

Enest L. Meyer, "Garnering the Gates in High-Density Arrays", 1988 *Semicustom Design Guide.*
"VLSI to Take Designs on Array Line", *Electronic News*, Mar. 21, 1988, p. 27.

Primary Examiner—Rolf Hille
Assistant Examiner—Wael Fahmy
Attorney, Agent, or Firm—Wilbert Hawk, Jr.; Casimer K. Salys

[57] ABSTRACT

A CMOS gate isolated gate array configured with a single polysilicon layer and preferably two metallization layers, wherein the cell pitch is equal to the first and second metallization pitches by referencing the metallization layers, contacts and vias to a grid, and referencing the polysilicon layer to a half grid. Further refinements include the use of channel regions between parallel and adjacent chains of complementary transistors, wherein the width of the channel is equal to three times the pitch of the cell. In another form, a base set of the gate array includes diffused resistors in the channel regions suitable for matching discretionary interconnection.

8 Claims, 3 Drawing Sheets

GATE ISOLATED BASE CELL STRUCTURE WITH OFF-GRID GATE POLYSILICON PATTERN

BACKGROUND OF THE INVENTION

The present invention relates to integrated circuit products. More particularly, the invention is directed to refinements in a gate array type application specific integrated circuit which use gate isolation to separate field effect transistors into distinct functional groups.

Gate arrays are used extensively to fabricate integrated circuits which perform customer specialized functions, and as such are a subclass of products known as application specific integrated circuits (ASICs). The semiconductor devices of the gate arrays are designed into base patterns and fabricated into wafers for customer specific functional interconnection during metallization. Consequently, the integrated circuit semiconductor devices can be interconnected to perform the logic functions desired by a customer in the relatively short time needed to form the metallization patterns.

The metallization by which the pre-existing transistors and other active devices in the base set are interconnected to form functional configurations now preferably utilizes two or more metallization layers, a pattern of contacts to connect from the metallization layers to the semiconductor regions, and selectively defined vias to interconnect the successive metallization patterns.

The trend toward higher density and therefore greater functional capability in individual integrated circuit chips at lower levels of power consumption has led to the concurrent movement toward the use of complementary MOS (CMOS) devices configured from smaller active device cells.

Designing a gate array base set or pattern which maximizes the number of electronic functions performed on a semiconductor chip of defined areas is not merely a matter of shrinking field effect transistor dimensions. Integrated circuit design rules impose a number of constraints on the interconnection of the transistors. For example, the gate array design must satisfy minimum polysilicon width dimensions, minimum spacing between polysilicon conductors, minimum metal width dimensions, minimum spacing between metal conductors, minimum dimensions for contacts, minimum dimensions for vias, and constraints as to vertical placement of the various consecutive layers. Furthermore, the gate array technical community has yet to reach a consensus as to the optimum and preferred approach for maximizing functional density per unit area of semiconductor chip, with one end of the present spectrum preferring the "sea-of-gates" approach, in which the whole surface is covered with field effect transistors capable of being interconnected, and the other end of the present spectrum represented by gate arrays which use elongated patterns of field effect transistors separated by wide wiring channel regions nominally twice the area of the transistor regions.

A relatively recent refinement in the design of gate arrays has been the introduction of gate isolation. According to this technology, a chain of field effect transistors, often individually referred to as gates or cells, is defined in the substrate with the source region of one serving as the drain region of the other in a continuum separated only by successive gate electrodes with underlying channel regions. Electrical isolation of active transistors is accomplished by tying the gate electrodes of the peripheral transistors to the power supply or the ground potential, respectively for the p-channel and n-channel devices. The interconnection as well as the tying is performed during metallization. Connection of the gates to perform isolation and electronic functions is preferably undertaken with computer aided design equipment in response to functional descriptions entered by a circuit designer.

Representative gate isolation type gate array technologies appear in U.S. Pat. Nos. 4,745,084; 4,570,176; 4,633,571; and 4,562,453; are described in the Mar. 21, 1988 issue of *Electronic News;* and are considered in the article by Meyer entitled "Garnering the Gates in High-Density Arrays" as appeared in *VLSI Systems Design-Semicustom Design Guide*—1988 on pages 8-20.

Gate array and standard cell arrangements which incorporate channels for interconnection are the subjects of the U.S. Pat. Nos. 4,161,662 and 4,661,815. However, neither reference attempts to define an optimum channel to transistors area ratio. U.S. Pat. No. 4,549,131 involves the use of crossunder diffusions, which are situated in gate array wiring channels, for resistor elements in gate array designs.

There remains the need for a high density gate array architecture using a channel based CMOS gate isolated configuration which has the transistor gate electrode pitch and metallization pitch relatively coincide while permitting full contact formation to both substrate and gate polysilicon, and which further includes an optimized channel width to maximize the functions implemented per unit area of a semiconductor chip.

SUMMARY OF THE INVENTION

The present invention features a gate array structure and architecture which is refined to maximize metal interconnect level routability and usable cell density for a channel type gate isolated CMOS product. As preferably implemented, it involves a single polysilicon layer gate electrode base cell structure with multiple metal layers for interconnect. Cell density is optimized through the use of a field effect transistor gate electrode arrangement in which the polysilicon gate electrode and pad patterns are shifted half a grid with reference to the metal level grid pattern. As a consequence of the shift, each transistor cell is capable of having a metal layer extend across the transistor, in parallel to the gate electrode, with full capability to make contact to both the substrate and polysilicon layers, and to have vias between the successive metal layers, without violating classic design rules.

As a second aspect of the invention, the channel regions between adjacent chains of CMOS gate isolated field effect transistor cells are optimized width to hold three metallization lines.

These and other features of the invention will be more fully understood and appreciated upon considering the detailed description which follows.

DESCRIPTION OF THE PREFERRED EMBODIMENT

Figure 1:
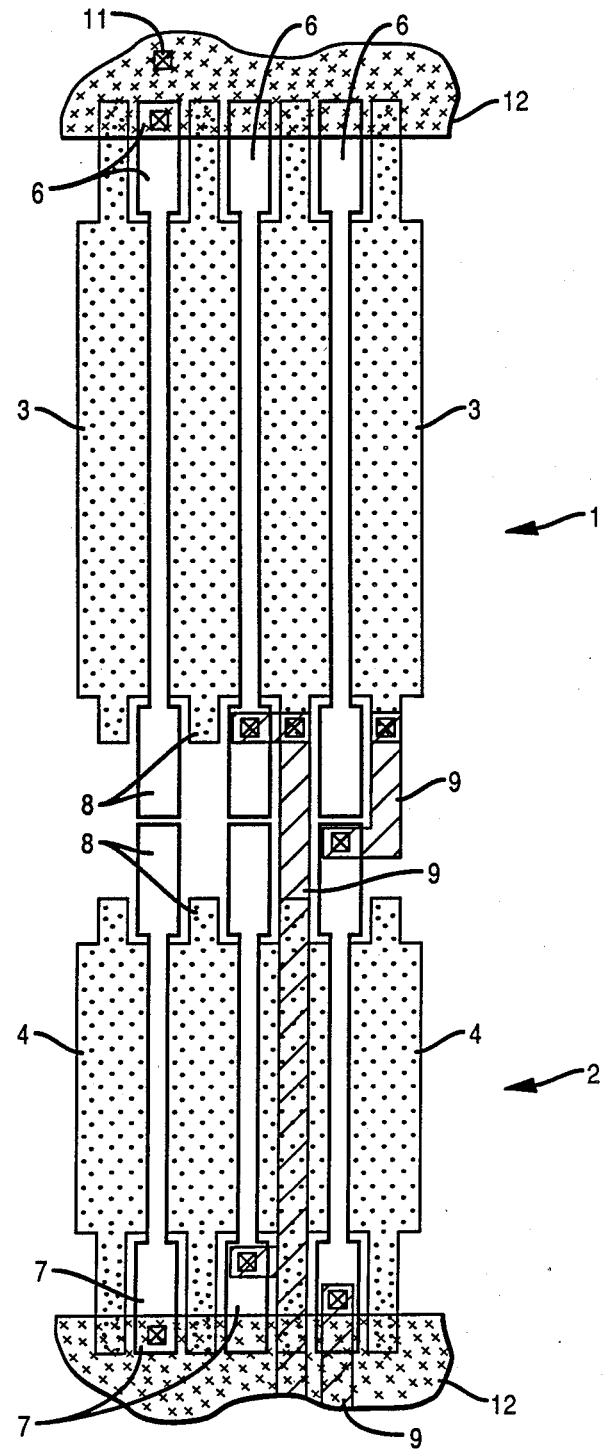
FIG. 1 is a schematic depicting a prior art gate array structure.

Gate isolated gate array products have been the subject of significant recent activity in the context of fabricating application specific integrated circuits (ASICs). FIG. 1 illustrates an arrangement of relatively recent vintage as set forth in U.S Pat. No. 4,745,084. FIG. 1 generally shows a succession of p-channel transistors 1 and closely located n-channel transistors 2 situated in respective chains with successive p-channel source/drain diffusion regions 3 and n-channel source/drain diffusion regions 4, separated by a respective successions of gate electrodes 6 and 7, and associated channel regions beneath each such gate electrode.

The spacing of successive tabs 8, used to make connection to the source/drain regions and the gate electrodes, establishes a minimum pitch for the field effect transistor chains. In part, this is attributable to design rules which mandate that source/drain regions, gate polysilicon patterns, metal patterns, contacts and vias have minimum widths and minimum coplanar and non-coplanar proximity dimensions. In terms of the prior art illustrated in FIG. 1, it should be apparent that the pitch of the first metal layer pattern 9 is nominally one half the pitch of the successive field effect transistor cells. For the structural arrangement of FIG. 1, reducing the dimensions of the source/drain regions 4 and polysilicon gate electrodes 6, in an attempt to place both the source/drain regions and gate electrodes under a common run of metal, will not succeed. The dimensions of the contacts for making connection between metal 9 and either polysilicon 6 or source/drain diffusion regions 4 impose lower limits on the reduction. Further constraints are imposed by design rules which do not allow the placement of vias, interconnects between metal layers, in regions having underlying polysilicon layers because of the step coverage problems otherwise commonly encountered in such situations.

Accordingly, there remains a need for a gate array cell structure in which the pitch of the cells matches the pitch of the metal interconnect pattern while retaining full flexibility in the making of contacts from the metal interconnect layers to the underlying source/ drain regions or polysilicon layers, and the further full capability to create vias between the multiple metal interconnect layers. Furthermore, it is desirable to have well ties made directly from the $V_{DD}$ or $V_{SS}$ bus at locations immediately adjacent the source/drain region in each cell. For the prior art in FIG. 1, the well tie contacts 11 are made through intermediate and distantly located doped diffused regions 12.

Competitive gate array products efficiently interconnect cell transistors into functional groups. A versatile interconnect architecture maximizes the utilization of gates per unit chip area, and as such is very important if chip size and associated cost are to be competitive. As to interconnect architectures, gate array designs have tended to migrate into somewhat opposite camps. The first camp, of relatively recent popularity, employs the concept known as "sea-of-gates", which is characterized in that the whole of the semiconductor surface is covered by field effect transistor gates/cells. Interconnection is undertaken with the recognition that the placement of interconnect metal patterns over many cells will effectively preclude their use as active devices in functional groupings. User experience has shown that the routability of a sea-of-gates array is in the range of 40%, for exemplary two-input NAND gate groupings. In terms of functional capability, this would mean that a chip having 100,000 gates is capable of utilizing approximately 40,000 gates in standardized functional groupings.

At the opposite extreme of the spectrum is the class of gate array designs which incorporates wide channels between chains of active gates/cells, channels nominally equivalent to the pitch of 20 metal lines. For such arrangements, it is not unusual to experience 90% routing efficiency. For a comparable semiconductor chip area, the wide channel gate array configuration can only have approximately 33,000 gates ($\frac{1}{3}$ of 100,000 gates), which if routed at 90% efficiency provides an effective yield of 30,000 gates for functional groups.

The present invention exceeds both configurations as to the routable and usable gates for a semiconductor chip of comparable size.

Figure 2:
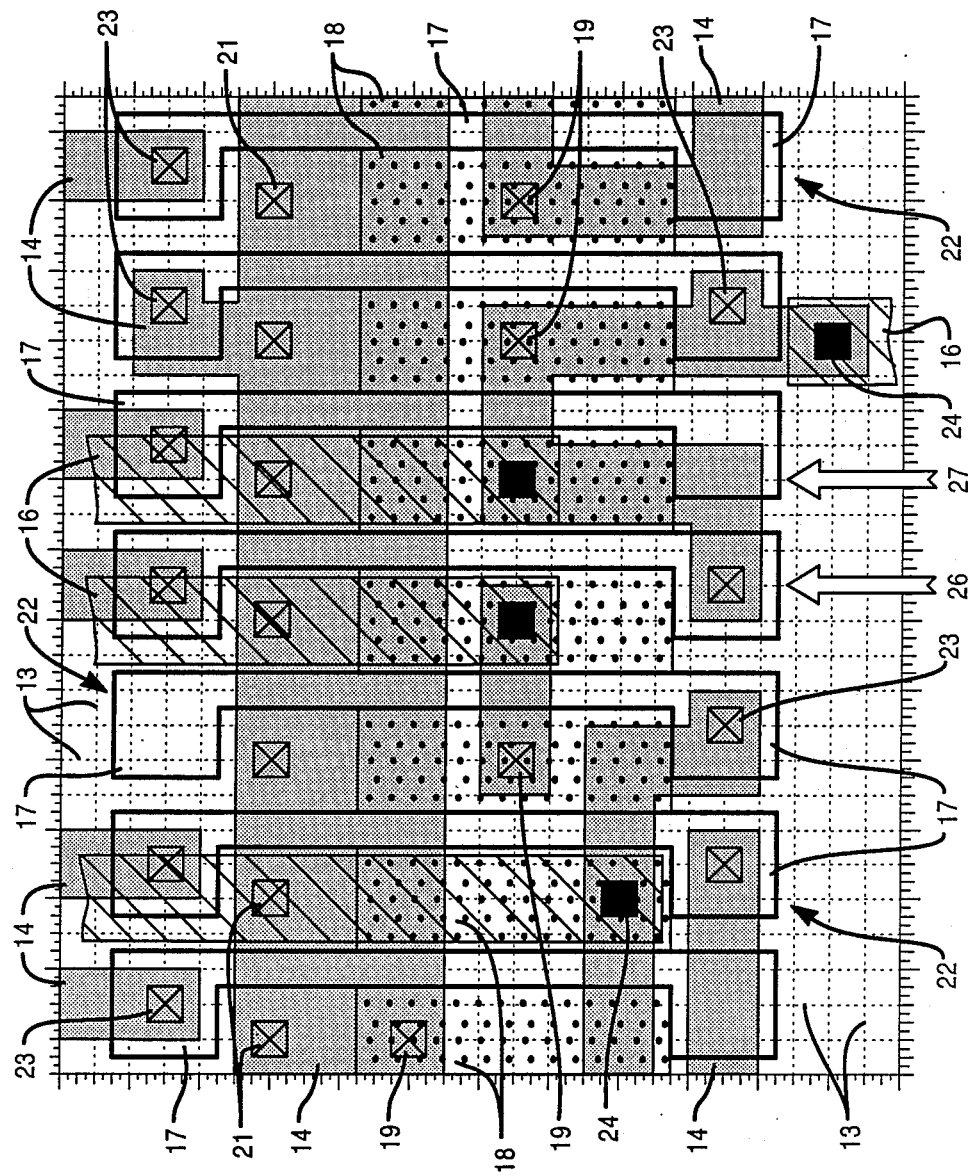
FIG. 2 is a schematic depicting a magnified area of an illustratively interconnected gate isolated gate array.

Before delving into the structural architecture which makes the embodying invention particularly suitable for contemporary gate array semiconductor fabrication, one needs to consider and appreciate the numerous design constraints and rules which bound the patterns in a gate array. The structural constraints and dimensional design rules imposed upon the embodiment in FIG. 2 are representative of an advanced gate array technology. As a first general constraint, vias interconnecting two metal layers may not overlap an edge of an underlying polysilicon layer. Next, vias, contacts, and all metal patterns must be referenced to a grid suitable for computer manipulation. As to minimum relative spacing, the minimum polysilicon spacing is one grid. The same minimum of one grid applies to the first metal layer spacing, while the second metal layer spacing is expanded to 1.5 grids. The contacts and vias are required to be one grid in width, and must be bounded by source/drain, polysilicon, metal 1 or metal 2 region extending at least one-half grid beyond the contact or via pattern. The widths of the polysilicon, first metal, and second metal lines are also constrained respectively to one grid, 1.5 grids, and two grids in minimum dimension.

In the context of such design parameters and constraints, an identified objective was to create a cell structure which matches the cell pitch to the lowest density metal pitch, in this case the second metal pitch, without unduly constraining the pattern of the first metal, the location of the contacts, or the location of the vias. The goal must, however, be accomplished in the context of a computer aided design grid pattern which facilitates automated layout and routing.

The desired objective was accomplished as embodied in FIG. 2 by displacing the polysilicon level gate electrode to a half grid alignment, while referencing the first metal layer patterns, the second metal layer patterns, the contacts, and the vias to the unit grid pattern. The solution is particularly appropriate when the grid pattern essentially coincides with the minimum dimensions of the polysilicon layer in width and relative spacing. This alignment of the polysilicon layer to the half grid in a gate array architecture is particularly suited to a gate isolated cell gate array base design, in that the computer aided design tools can operate unencumbered on the basis of a highly structured and readily defined grid pattern.

FIG. 2 illustrates a portion of the embodying gate isolated gate array pattern in the context of a grid pattern 13 as might appear on a video display of a computer aided design system. The first metal layer is shown by a shaded pattern 14. The second metal layer 16 is shown by cross-hatching. The first polysilicon layer patterns for the transistor gate electrode are shown by heavy out lines at 17. The source/drain diffusions in the semiconductor substrate are shown as dotted regions 18 between successive gate electrodes 17. Contacts which make connection between the first metal layer and the semiconductor substrate in the source/drain regions are shown at 19, while contacts between the first metal layer and the transistor well regions are shown at 21. Contacts between the first metal layer and the polysilicon are done in the polysilicon pad regions, generally 22, and are identified by reference numeral 23. The vias connecting first metal to second metal are shown at 24. Note that the edge of the polysilicon pattern is always situated with reference to the half grid, while the first metal pattern is defined with reference to the grid pattern itself.

It will be noted from FIG. 2 that the source/drain regions 18 are separated by four grids in the horizontal direction. Thus, the "grid reference" in the horizontal direction is defined by four grids 13. Second metal patterns 16 overlie selected regions 18 and therefore also fall on the "grid reference." Similarly, intermetal vias 24 and source/drain contacts 19 fall on the "grid reference" in the horizontal direction. However, the polysilicon gates 17 are centered midway between the "grid reference" and are therefore referenced to the "half grid." In the vertical direction intermetal vias 24 are separated by three grids 13 or a multiple of three grids. Thus, the "grid reference" in the vertical direction is defined by three of the grids 13. Source/drain contacts 19 and the horizontal runs of first metal layer 14 are also centered on the three grid vertical "grid reference." Hence, the "grid reference" shown in FIG. 2 is a rectangular grid of four grids 13 horizontally by three grids 13 vertically.

The two grid minimum width of first metal pattern at each contact coincides and matches the half grid placement of the polysilicon layer in the pad regions 22. Further note that the contacts 19 from the first metal to the substrate are fully situated within the two grid dimension.

The difficulty of concurrently satisfying the numerous minimum dimension and spacing requirements, as well as the other design constraints, should not be underestimated. Recall that the recognized prevailing objective is to define a cell structure in which the pitch of the cells is equal to the minimum design rule pitch of the metal layers, while retaining full capability to make contact connections from the metal to the polysilicon gate or the source/drain, and to make via connections between the metal layers within each cell. This capability as to interconnection is illustrated in the succession of cells at 26 and 27, where there appear within the pitch spacing of one cell contacts between first metal and the polysilicon pad, contacts between first metal and the substrate, and vias between first and second metal, without violations of minimum dimensions, relatively spacings or vias locations, and within the framework of a grid suitable to operate on a computer aided design system.

Though the polysilicon gate electrode pattern could be aligned to the grid pattern without violating the one grid minimum relative spacing dimension and still retain the contact access from the first metal to the polysilicon or semiconductor substrate, the translated polysilicon gate pattern would violate via location design constraints in the creation of an overlap with the polysilicon pattern. Analogous translations of the first or second metal patterns relative to such grid aligned polysilicon pattern will show similar fundamental constraint violations in the placement of contacts or vias, or in the alternative, restrictions on the use of vias within the source/drain regions of the cells. Increasing the metal pitch is obviously not a meaningful solution if functional density is an important consideration.

Figure 3:
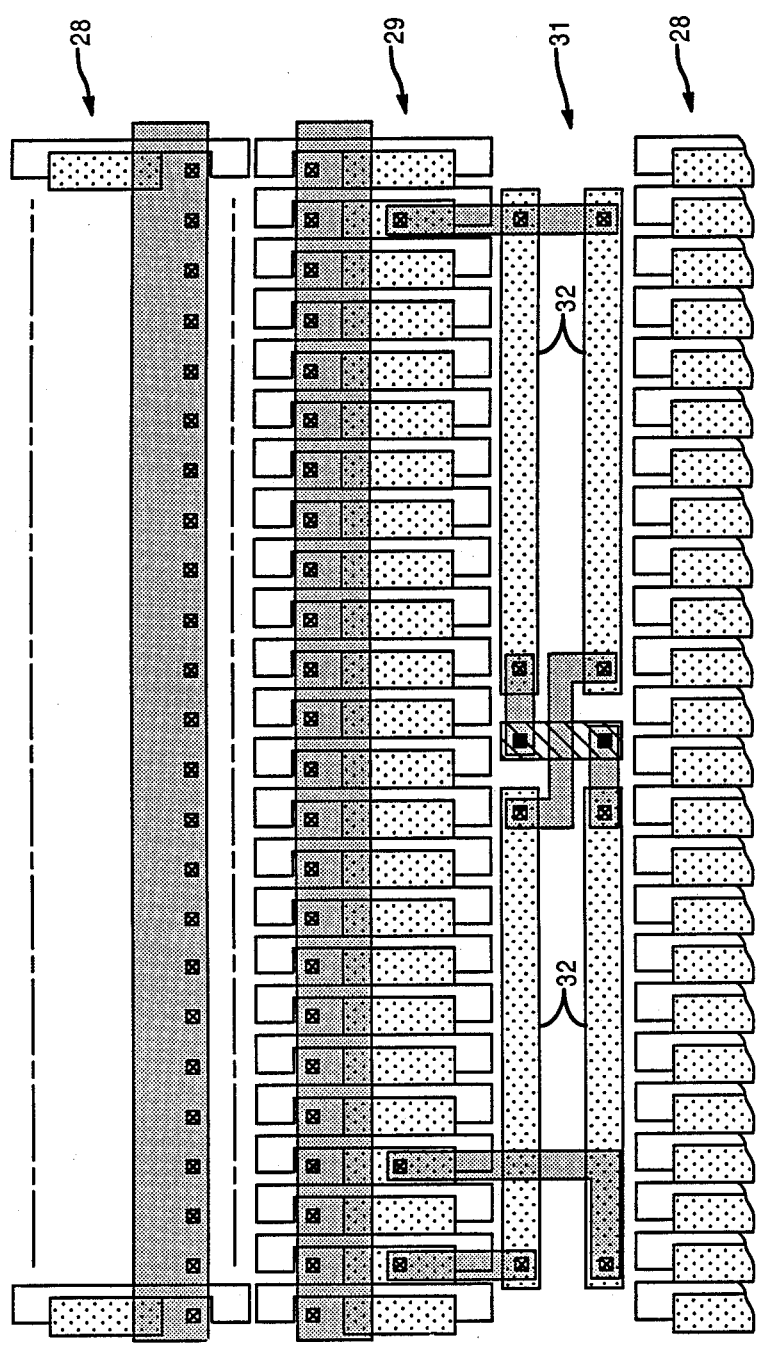
FIG. 3 schematically illustrates the layout structure of the present invention with channels and channel disposed devices.

An expanded depiction of the embodied cell architecture appears in FIG. 3 for purposes of illustrating another refinement. The preferred arrangement in FIG. 3 includes parallel and adjacent chains of p-channel transistors 28 and n-channel transistors 29 separated by a wiring channel 31. According to another aspect of the present invention, the wiring channel is defined to have a width equal to the pitch dimension of three cells, and as such is capable of conveying three adjacent metal or diffused conductive lines. Investigation has determined that for a CMOS gate isolated array configured with one polysilicon layer and two metallization layers, and having the presently described match in pitch of the cell, the first metal and the second metal, a channel width corresponding to the pitch of three metal lines provides an optimum balance between the area allocated to wiring and the area allocated to cells on the basis of usable gates. For example, increasing the width of channel 31 permits greater interconnect utilization of the cells, but results in a reallocation of chip area. The consequential cell gate count loss exceeds the functional gain attributed to greater interconnection. Similarly, decreasing the channel width results in an unused gate increase greater than the gain in cell count.

FIG. 3 also illustrates another feature of the present invention. Diffused resistors 32 are formed in channel region 31 for immediate and direct interconnection to the cells of the gate array. Unconnected resistors 32 do not restrict the use of the channel 31 for wiring in that they are situated within the substrate and electrically isolated from both the metal 1 and metal 2 wiring levels. As a consequence, a multiplicity of the resistors can be formed during the creation of the base set for the gate array. The resistors are then available for discretionary interconnection without otherwise affecting the cell count of the array. As a further feature, the physical proximity of such diffused resistors optimizes the likelihood of matching both electrical and temperature parameters. For example, the set of resistors 32 shown in channel 31 are interconnected in a cross-coupled manner to maximize matching as may be required for a precise differential application.

The half grid alignment of the gate polysilicon layer, in combination with a channel region of width equal to the pitch of three cells provides a gate array with exceptionally high usable gate density. This architecture provides a cell pitch which matches the metallization pitch while providing full ability to form contacts to the substrate or polysilicon layers, and vias within each source/drain region of the cell transistors. For the described CMOS design with matched cell and metallization pitch, the three metallization line channel width provides the optimum balance between cell count and cell utilization for typical random logic applications. The width of channel 31 is obviously related to the number of metallization layers used to fabricate the gate array product.

It will be understood by those skilled in the art that the embodiment set forth hereinbefore are merely exemplary of the numerous arrangements by which the invention may be practiced, and as such may be replaced by equivalents without departing from the invention in which will now be defined by appended claims.

I claim:

1. A two metal layer integrated circuit gate array configured from a chain of polysilicon gate isolated field effect transistors, comprising:
   a grid reference to the source/drain regions of the field effect transistors;
   a first metal layer pattern referenced to the grid;
   a second metal layer pattern referenced to the grid;
   a source/drain contact referenced to the grid;
   an intermetal via referenced to the grid; and
   a gate polysilicon pattern referenced to the half grid.

2. The apparatus recited in claim 1, wherein the gate polysilicon contact region is displaced relatively to the gate electrode defining the field effect transistor channel.

3. The apparatus recited in claim 2, wherein the pitch of the gate polysilicon pattern, the contact pattern, the via pattern, the first metal layer pattern, and the second metal layer pattern are substantially equal in magnitude.

4. The apparatus recited in claim 3, wherein the minimum gate polysilicon spacing and first metal layer spacing are one grid, and the minimum contact width, vias width and gate polysilicon width are one grid.

5. The apparatus recited in claim 4, wherein contacts and vias are defined within two grid dimension regions of source/drain, gate polysilicon, first metal or second metal.

6. A two metal layer integrated circuit gate array configured with polysilicon gate isolated field effect transistors in chains of adjacent and complementary pairs, characterized by the presence of channel regions between adjacent chain pairs having a channel width suitable to form three metal lines.

7. The apparatus recited in claim 6, wherein the channel regions contain matched resistive elements diffused into the integrated circuit gate array substrate and extend in a direction parallel to the channel.

8. The apparatus recited in claim 7, wherein the diffused resistive elements are comparable in width to the metal lines.

* * * * *